(12) United States Patent
Wang et al.

(10) Patent No.: US 9,336,347 B2
(45) Date of Patent: May 10, 2016

(54) CAPACITOR ARRAY AND LAYOUT DESIGN METHOD THEREOF

(71) Applicant: China Electronic Technology Corporation, 24th Research Institute, Chongqing (CN)

(72) Inventors: Yan Wang, Chongqing (CN); Yu-Xin Wang, Chongqing (CN); Gang-Yi Hu, Chongqing (CN); Ting Li, Chongqing (CN); Tao Liu, Chongqing (CN); Guang-Bing Chen, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 49 days.

(21) Appl. No.: 14/396,737

(22) PCT Filed: Nov. 28, 2013

(86) PCT No.: PCT/CN2013/087992
§ 371 (c)(1),
(2) Date: Oct. 23, 2014

(87) PCT Pub. No.: WO2015/058437
PCT Pub. Date: Apr. 30, 2015

(65) Prior Publication Data
US 2015/0370952 A1 Dec. 24, 2015

(30) Foreign Application Priority Data

Oct. 23, 2013 (CN) .......................... 2013 1 0502617

(51) Int. Cl.
*H01G 4/38* (2006.01)
*G06F 17/50* (2006.01)
*H01G 15/00* (2013.01)
*H03M 1/16* (2006.01)
*H03M 1/44* (2006.01)

(52) U.S. Cl.
CPC ............ *G06F 17/5072* (2013.01); *G06F 17/50* (2013.01); *H01G 4/38* (2013.01); *H01G 15/00* (2013.01); *H03M 1/164* (2013.01); *H03M 1/442* (2013.01)

(58) Field of Classification Search
CPC ........... H01G 4/38; H01G 4/005; H01G 4/12; H01G 4/228; H01G 4/232; H01G 4/06
USPC ................ 361/303–305, 306.1, 306.3, 301.4, 361/328–330
See application file for complete search history.

(56) References Cited

U.S. PATENT DOCUMENTS

| | | | | |
|---|---|---|---|---|
| 7,724,496 B2* | 5/2010 | Eggerding | ............. | H01G 4/012 361/303 |
| 8,004,819 B2* | 8/2011 | Nagamiya | ............... | H01G 4/012 361/303 |
| 8,107,214 B2* | 1/2012 | Aoki | ...................... | H01G 4/012 361/303 |
| 8,537,523 B1* | 9/2013 | Chen | ........................ | H01G 4/33 361/303 |
| 8,770,002 B2* | 7/2014 | Takahashi | ................. | B21F 3/02 72/137 |
| 2006/0092595 A1* | 5/2006 | Hwa Lee | ............... | H01G 2/065 361/306.3 |

FOREIGN PATENT DOCUMENTS

| | | |
|---|---|---|
| CN | 101097913 A | 1/2008 |
| CN | 103023504 A | 4/2013 |
| JP | 2004-207518 A | 7/2004 |

* cited by examiner

*Primary Examiner* — Nguyen T Ha
(74) *Attorney, Agent, or Firm* — Cheng-Ju Chiang

(57) ABSTRACT

A layout design method is provided for generating capacitor arrays being described in four steps: first, the wiring mode of unit capacitors is defined allowing the wire being connected to the upper plate to parallel that to the lower one, second, a capacitor array layout is designed with capacitors being distributed in Mh lines, Mh is the maximum of capacitors' lines, the line numbers of Class 1 to Class K capacitors are defined in the unilateral capacitor array, third, the wiring mode is set for capacitor array making sure the lengths of the wires to the upper and lower plates of unit capacitors are equal, at last, parasitic parameters are characterized in ways that verify the layout. A capacitor array is provided as well. By eliminating capacitance mismatching caused by parasitic capacitance, the method works to generate a well-matched capacitor array in an easy and efficient way.

12 Claims, 8 Drawing Sheets

US 9,336,347 B2

CAPACITOR ARRAY AND LAYOUT DESIGN METHOD THEREOF

CROSS REFERENCE TO RELATED APPLICATIONS

The present application is a 35 U.S.C. §371 National Phase conversion of International (PCT) Patent Application No. PCT/CN2013/087992, filed on Nov. 28, 2013, the disclosure of which is incorporated by reference herein. The PCT International Patent Application was filed in Chinese.

1. FIELD OF THE INVENTION

The invention relates to a capacitor array and its layout design method.

2. DESCRIPTION OF RELATED ART

Because of high speed, high resolution, low power and small size, pipelined Analog to Digital Converters (ADCs) have wide application in wideband communication system and video image process. As shown in FIG. 1, the pipelined ADC's conversion circuit includes N stages of sub-stage conversion circuits 101A, 101B ... 101N and a Flash ADC 102. An analog signal VIN, as an input signal, is converted into k(1) bit digital codes and residual difference analog voltage Vres1 through the first sub-stage 101A (Stage 1 as shown in FIG. 1). The residual difference analog voltage Vres1 is then sent to the second sub-stage 101B (stage 2 as shown in FIG. 1) and converted into k(2) bit digital codes and residual difference analog voltage Vres2. In the same way, the residual difference analog voltage Vres(N−1) is sent to the N substage 101N (stage N as shown in FIG. 1). Then the N substage 101N outputs k(N) bit digital codes and residual difference analog voltage VresN into the flash ADC 102. Last, k(N+1) bit digital codes are obtained and input into back-end circuit.

FIG. 2 is a circuit diagram showing one of the sub-stages 101A, 101B ... 101N including a Sample/Hold (S/H) circuit 201, a subtraction circuit (SUB) 202, a gain amplification circuit (Gain) 203, a low resolution Sub-ADC 204, and a Sub-DAC 205. How it works is described as follows: a signal from the previous sub-stage is an input signal Vi for the sub-stage. The input signal Vi for the first sub-stage 101A is the input signal VIN from pipelined ADC. The S/H circuit 201 of the first sub-stage is used for sampling input signal Vi. The Sub-ADC 204 is designed for analog to digital conversion of signal Vi. Then k bit digital codes are obtained through Sub-ADC 204 being input into Sub-DAC 205 where k bit digital codes are converted into analog estimated value. The estimated value is subtracted from the input signal Vi through SUB circuit 202. The result is amplified through gain amplification circuit (Gain) 203 which produces a residual voltage Vres as an input signal for the next sub-stage. As to the circuit mentioned above, it is defined as a Multiplying Digital-to-Analog Converter being realized by an S/H circuit 201, a subtraction circuit 202, a Gain amplification circuit 203, and a Sub-DAC 205 in association with the switched-capacitor circuits.

FIG. 3 is a circuit diagram of an MDAC. The MDAC is realized through switched capacitors from a unit capacitor array for a better capacitance matching. As shown in FIG. 3, an MDAC includes a capacitor array 301, a Residual Amplifier (RA) 302, and switches and is controlled by sampling phase clock signal Φ1 and amplification phase clock signal Φ2. Signal Φ1 and Φ1e are sampling phase clock signals. Signal Φ2 is a feedback phase clock. The end of sampling phase clock signal Φ1e comes before that of the sampling phase clock signal Φ1 when it is at high level. FIG. 4 is a timing diagram for sampling phase clock signal Φ1, Φ1e and feedback phase clock signal Φ2. The upper plates of all capacitors (including sampling capacitors Cf1, Cf2, and feedback capacitors Cs1, Cs2) in the capacitor array 301 are connected to the input end of residual amplifier 302. The lower plates are put into four categories depending on wiring modes.

Consisting of x1 unit capacitors C, sampling capacitor Cs1 is connected to input signal Vi sampling input signal Vi at sampling phase. Depending on output codes of comparators, switches are on or off being connected to reference level DVR at amplification phase. Comprising x2 unit capacitors, sampling capacitor Cs2 is connected to input signal Vi sampling input signal Vi at sampling phase and grounded at amplification phase. Comprising x3 unit capacitors, a feedback capacitor Cf1 is connected to input signal Vi sampling input signal Vi at sampling phase and connected to a Residual Amplifier 302 outputting residual difference analog voltage Vres at amplification phase. Consisting of x4 unit capacitors, a feedback capacitor Cf2 is connected to the Residual Amplifier 302 outputting residual difference analog voltage Vres at both sampling phase and amplification phase. Various transfer functions of the MDAC can be realized by choosing various numbers of unit capacitors and wiring modes for capacitors Cs1, Cs2, Cf1 and Cf2.

According to the law of charge conservation, the MDAC's transfer function is expressed as follows with the gain error of Residual Amplifier 302 being ignored:

$$Vres=[(Cs1+Cs2+Cf1)/(Cf1+Cf2)][Vi-(DVrCs1)/(Cs1+Cs2+Cf1)]$$

According to the expression, the gain of MDAC's transfer function is the ratio of the sum of Cs1, Cs2 and Cf1 to the sum of Cf1 and Cf2. Theoretically, it is expressed as (x1+x2+x3)/(x3+x4). Therefore, the unit capacitor C must be the same for all capacitors. Otherwise it leads to gain errors deteriorating the performance of MDAC. The DAC's level of the transfer function is related to the ratio of capacitance which is expressed as [Cs1/(Cs1+Cs2+Cf1)]. It works likewise requiring the same unit capacitor C. Otherwise leads to an unexpected DAC's level. In a word, if each unit capacitor weights differently, the MDAC may put up a bad performance or even come to ADCs' failure.

Capacitance mismatching errors are mainly divided into system error and random error. System error can be diminished or avoided by designing a perfect layout. The system error of capacitance mismatching is mainly caused by: (1) mismatched perimeter ratio caused by lithography process, (2) proximity effect in unit capacitor photolithography, (3) oxidation gradients and (4) mismatched parasitic capacitance.

Regarding mismatched parasitic capacitance (1), a large capacitor can be realized by connecting unit capacitors in parallel in ways that make the perimeter ratio of capacitors be identical with the area ratio of capacitors. And with that, the problem of mismatched perimeter (1) can be solved. In case of proximity effect in unit capacitor photolithography (2), dummy capacitors are added to the blank area of capacitor array to generate a layout of same ambient for each unit capacitor. The conventional layout of concentric unit capacitor arrays was applied in ways that diminish the effect of asymmetric oxidation slope (3) on the precision of capacitor matching. But it works only when it requires a few types of capacitor matching. A concentric layout features complexity and complicated wiring modes leading to increased inner and external lead parasitic capacitance, mismatching caused by parasitic capacitance and unnecessary chip size as capacitance matching types increases.

Regarding mismatched parasitic capacitance (4), parasitic capacitance exists between upper and lower plates and neighboring wires which make the value of unit capacitance CA equal to the sum of capacitance C and parasitic capacitance Cp, as shown in FIG. 5. A wire, together with the neighboring upper and lower plates, leads to a parasitic capacitance Cp as shown in FIG. 6. FIG. 7 is showing a parasitic capacitance Cp caused by extra part of the lower plate and a lead when a voltage is added to the upper plate. Different layouts and wiring modes of MDAC capacitor array have various parasitic capacitance of each unit capacitor which leads to different unit capacitance CA causing mismatched capacitance, gain errors of transfer function and DAC's error. It has bad influence on the performance of MDAC and the linearity of ADC and even contributes to the failure of ADCs.

As MOS technology grows, the size of capacitors decreases and parasitic capacitance, being larger than unit capacitance, can no longer be ignored. Therefore, an improved layout and wiring mode of capacitor array are in need for advanced technologies. It is a challenge to design an MDAC capacitor array layout within a limited area eradicating mismatching error of capacitance caused by parasitic capacitance and generating a matched capacitor array.

3. BRIEF SUMMARY OF THE INVENTION

It is an object of the invention to provide a layout design method to generate a matched unit capacitor array. The invention helps to eliminate capacitance mismatching error caused by parasitic capacitance in ways that generate a matched capacitor array. Featuring simplicity and small sized capacitor array, the invention can find applications in digital-to-analog converters requiring well-matched capacitor arrays and switched capacitance filters in general and high resolution pipelined ADC in particular.

Firstly, the invention provides a design method for capacitor array layout including Class 1 to Class K capacitors (K is an integer no less than 1). Each capacitor includes several unit capacitors. The design method for capacitor array layout is described as follows.

The wiring mode of unit capacitors is defined allowing the wire being connected to the upper plate to parallel the wire to the lower one. And the wires to the lower plates of unit capacitors are the same kind of metal being designed symmetrically on the both sides of each unit capacitor. The wires to the upper plates of unit capacitors are the same kind of metal being centered at each unit capacitor.

The layout of a capacitor array is designed with capacitors being distributed in M lines and N rows. The capacitor array consists of inner capacitor array and external dummy capacitor array. The dummy capacitor array is designed around the inner capacitor array being made up of dummy capacitors. The inner capacitor array includes two symmetric unilateral inner capacitor arrays: (a) Mh is defined as the maximum number of lines of unilateral inner capacitor array and expressed as Mh=M/2−Mdx, wherein Mh is an integer, Mdx denotes the line number of external dummy capacitor array, Mdx≥1.5. (b) The line numbers of Class 1 to Class K capacitors are defined for unilateral inner capacitor array. (c) Capacitors are placed on the layout wherein the sum of line numbers of Class 1 to Class K capacitors is no more than Mh and no more than two wiring modes are used for capacitors in each line.

The wiring mode is set for capacitor array requiring that the lengths of the paralleled wires being connected to the upper and lower plates are equal; and Parasitic parameters are characterized in ways that verify the layout design.

Wherein, according to step (b) "The line numbers of Class 1 to Class K capacitors are defined for unilateral inner capacitor array", if one kind of capacitors consists of x1 unit capacitors applying several wiring modes to unit capacitors, the least lines of the capacitor equals to x1/2.

Wherein, as to the step of defining capacitor array layout, dummy capacitors are added at the blank area of unilateral inner capacitor array after defining Mh and the line numbers of each type of capacitors in the layout.

Wherein, if two different wiring modes are used for one line of capacitors, only one of two metal wires, being designed at both sides of the lower plates of unit capacitor, is connected to the lower plate of unit capacitor through via.

Wherein, if only one wiring mode is used for one line of capacitors, both metal wires, being designed at the lower plates of unit capacitor, are connected to the lower plate of unit capacitor through via.

Secondly, the invention provides a capacitor array with capacitors being placed in M lines and N rows. The capacitor array consists of inner capacitor array and dummy capacitor array in the periphery. The dummy capacitor array includes several dummy capacitors being placed around the inner capacitor array. The inner capacitor array has two symmetric unilateral inner capacitor arrays including Class 1 to Class K capacitors (K is an integer no less than 1). The capacitor consists of several unit capacitors. Wherein, the wiring mode of unit capacitors is defined allowing the wire being connected to the upper plate to parallel the wire to the lower one. And the wires to the lower plates of unit capacitors are the same kind of metal being designed symmetrically on the both sides of each unit capacitor. The wires to the upper plates of unit capacitors are the same kind of metal being centered at each unit capacitor. The lengths of the wires to the upper and lower plates are equal. Mh is defined as the maximum number of lines of unilateral inner capacitor array and expressed as Mh=M/2−Mdx, where Mh is an integer, Mdx denotes the line number of dummy capacitor array in the periphery and its value is no less than 1.5. The sum of line numbers of Class 1 to Class K capacitors is no more than Mh and no more than two wiring modes are used for capacitors in each line.

Wherein, if one class of capacitors consists of x1 unit capacitors applying several wiring modes to unit capacitors, the least lines of this class of capacitors equals to x1/2.

Wherein, dummy capacitors are added at the blank area of unilateral inner capacitor array except the area being filled with Class 1 to Class K capacitors.

Wherein, Wherein, if two different wiring modes are used for one line of capacitors, only one of two metal wires, being designed at the lower plates of unit capacitor, is connected to the lower plate of unit capacitor through via.

Wherein, if only one wiring mode is used for one line of capacitors, both metal wires, being designed at the lower plates of unit capacitor, are connected to the lower plate of unit capacitor through via.

The invention provides a layout design method to generate a well-matched unit capacitor array. The invention helps to eliminate capacitance mismatching error caused by parasitic capacitance in ways that generate a matched capacitor array. Featuring simplicity and small sized capacitor array, the invention can find applications in digital-to-analog converters requiring well-matched capacitor arrays and switched capacitance filters in general and high resolution pipelined ADC in particular.

4. BRIEF DESCRIPTION OF THE DRAWINGS

To better understand the objects, technologies and advantages of the invention, the accompanying drawings are referred to for further description, wherein FIG. 1 is a schematic diagram of a pipelined analog-to-digital converter.

Figure 5:
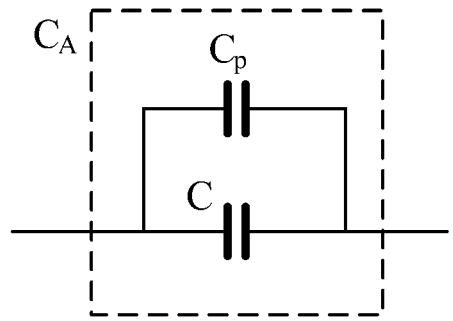
Figure 6:
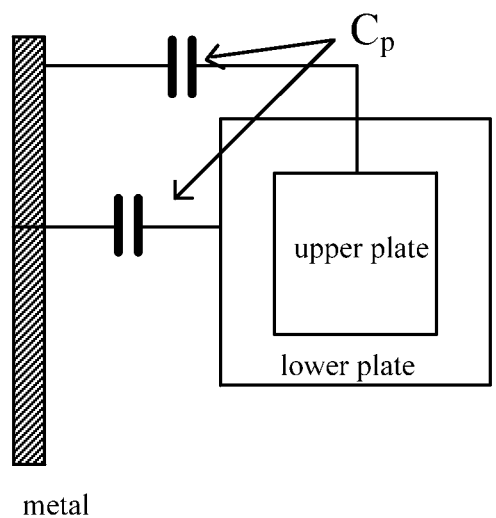
Figure 7:
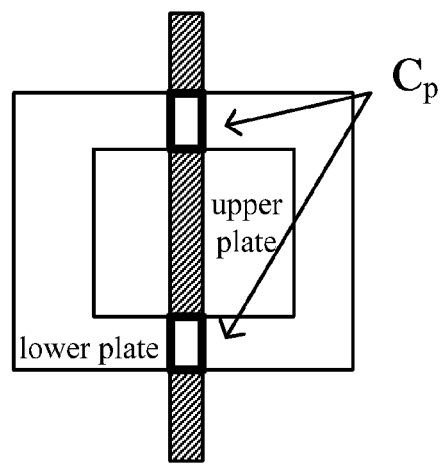

FIG. 5, FIG. 6, and FIG. 7 are showing parasitic capacitance of unit capacitors.

Figure 8:
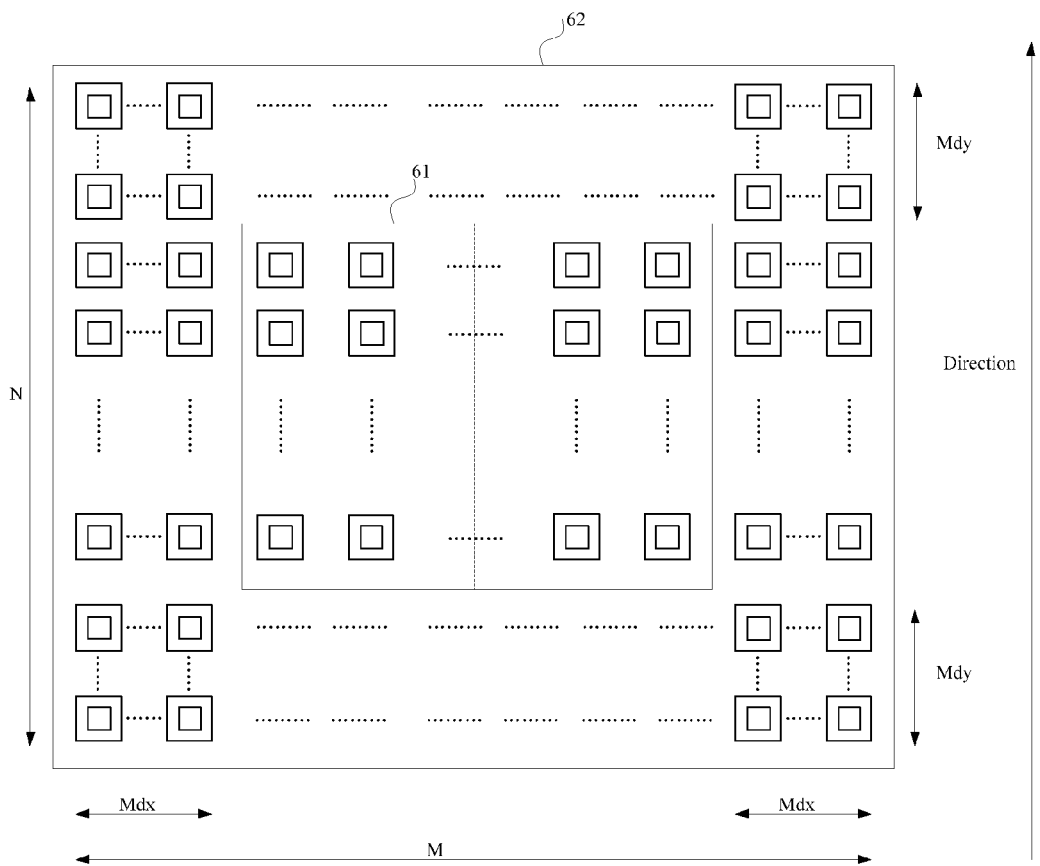

FIG. 8 is a schematic of an embodiment for a capacitor array.

Figure 9:
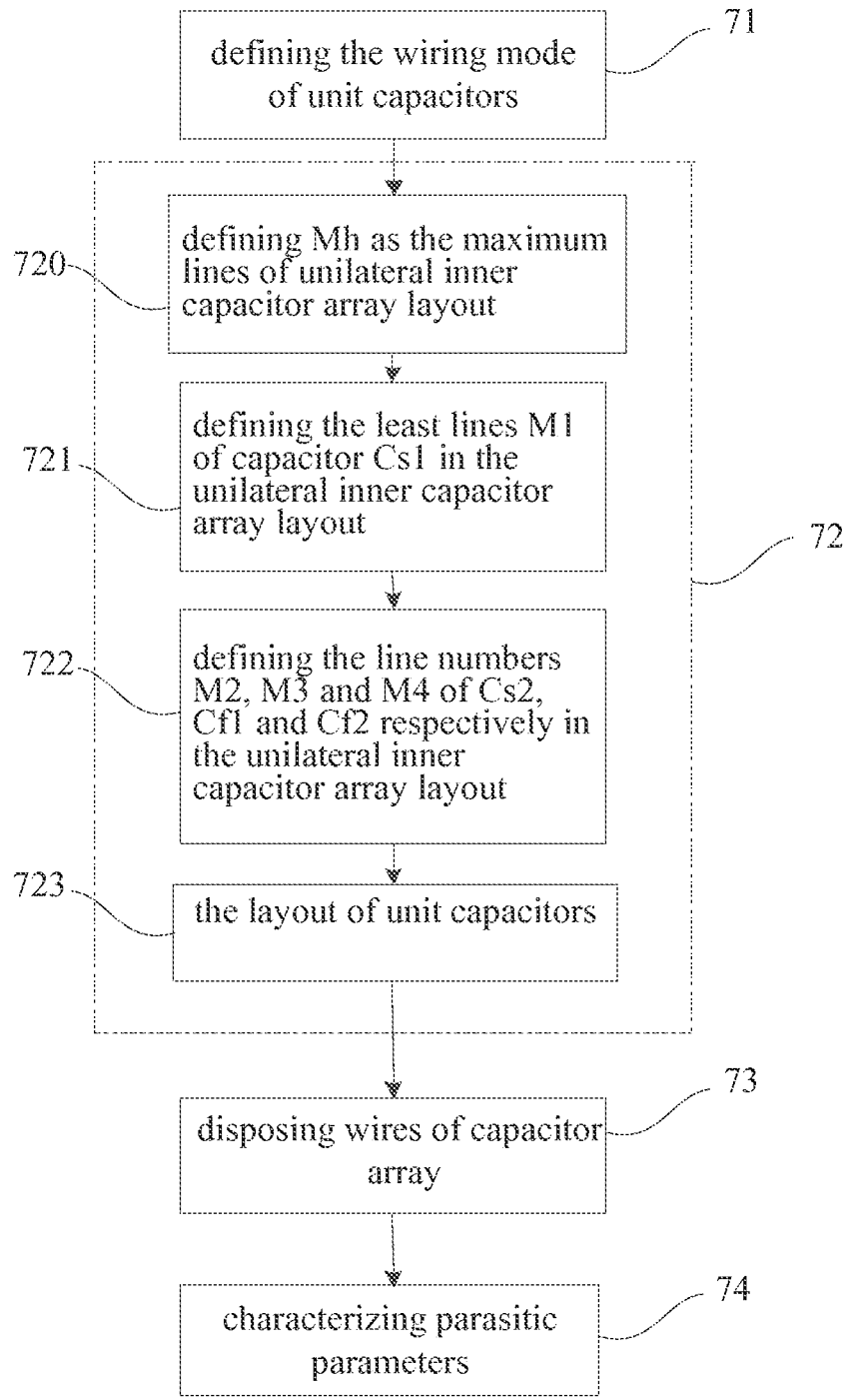

FIG. 9 is a flow diagram of how to design a capacitor array layout.

Figure 10:
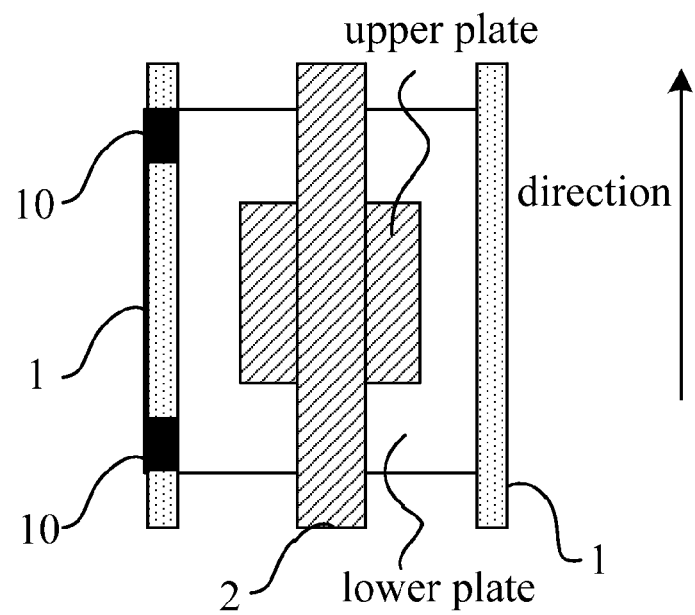

FIG. 10 is a schematic of wiring modes for capacitors.

Figure 11:
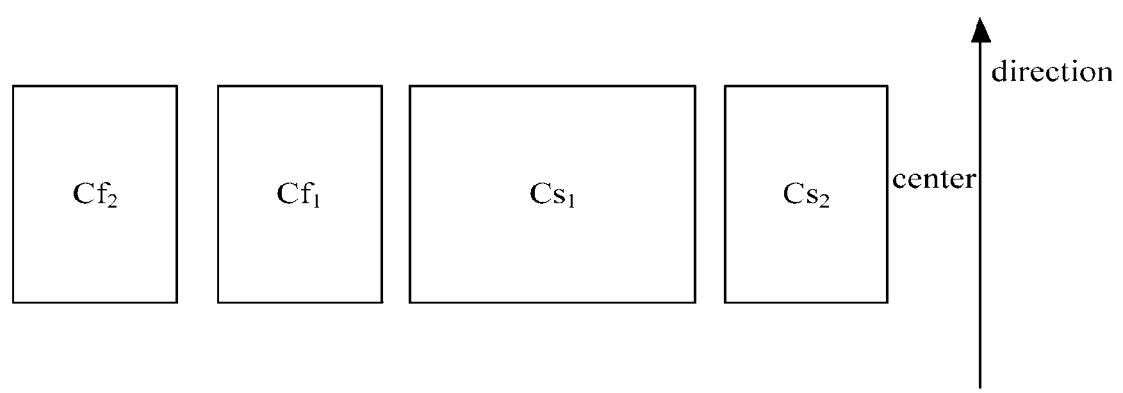

FIG. 11 is a schematic of a capacitor array layout.

Figure 12:
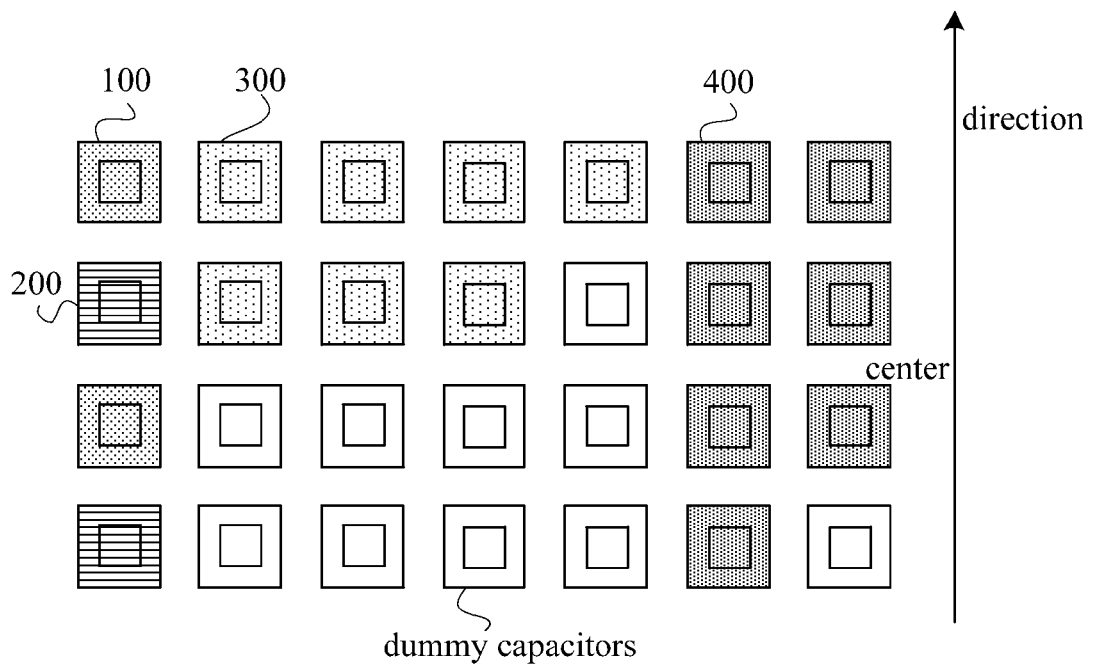

FIG. 12 is a layout schematic for the capacitor array.

Figure 13:
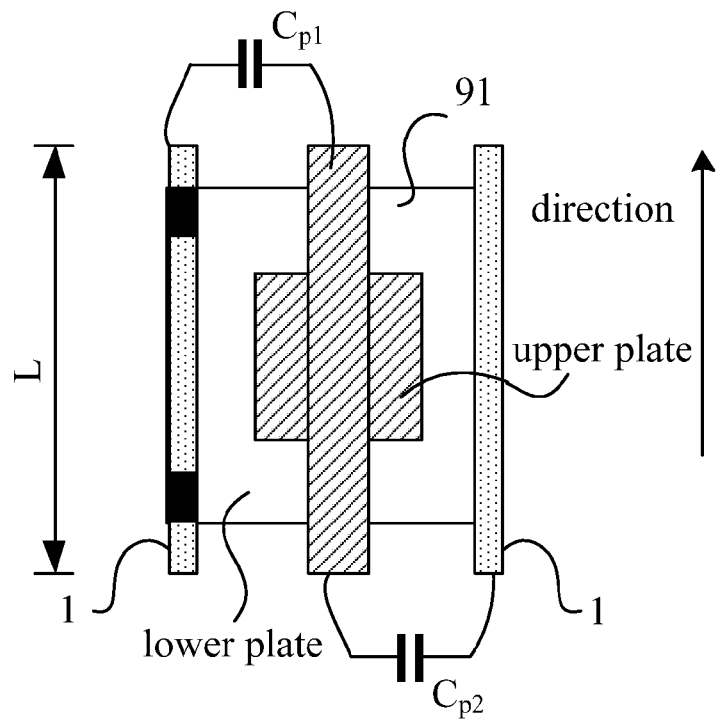

FIG. 13 is a schematic of parasitic capacitance of unit capacitors.

Figure 14:
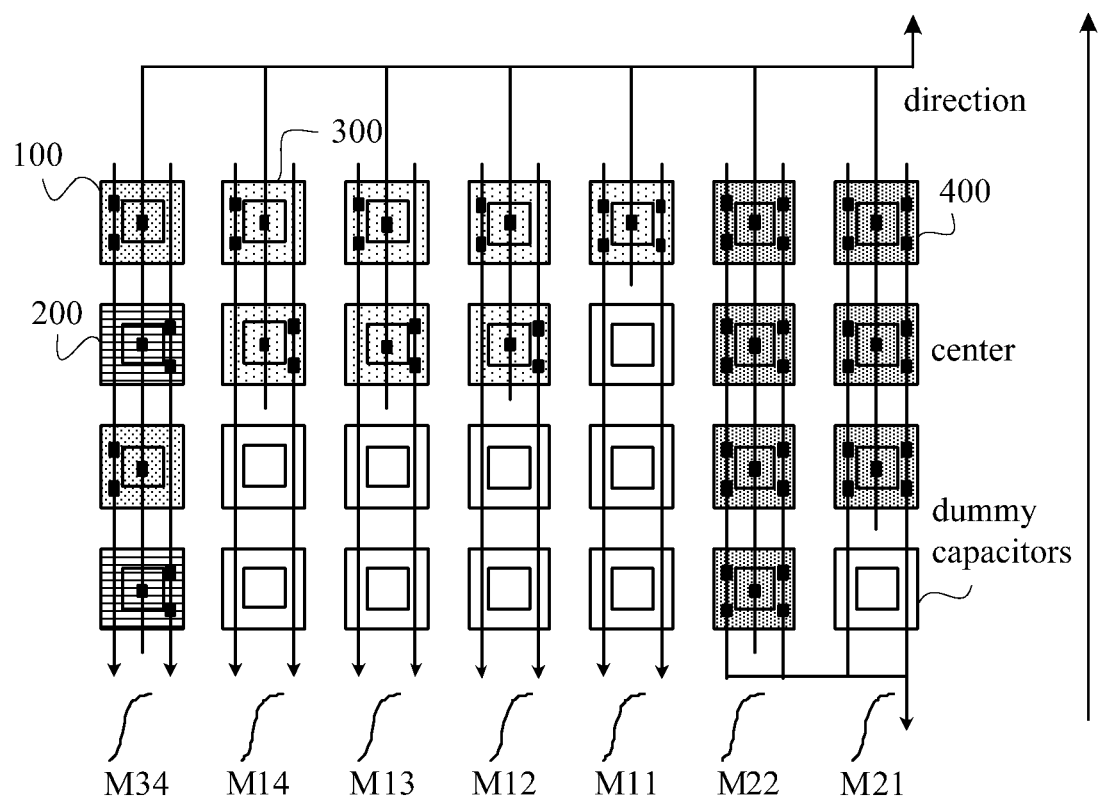

FIG. 14 is a schematic of wiring modes of the present capacitor array.

5. DETAILED DESCRIPTION OF THE INVENTION

Hereinafter, the preferred embodiments of the present invention will be described with the accompanying drawings. It should be understood that the following embodiments are provided just for describing the invention, instead of limiting the property protection scope of the invention.

The MDAC capacitor array, featuring symmetric unilateral capacitor arrays, is generated by designing one side of symmetric unilateral capacitor arrays. One unilateral capacitor array of MDAC capacitor array is illustrated for the capacitor array layout design of pipelined ADC.

Figure 1:
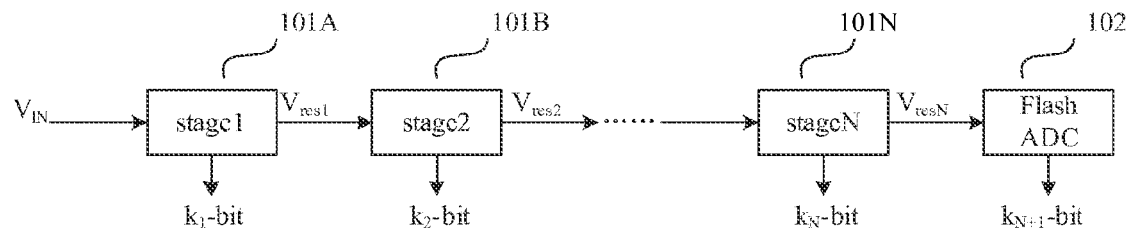
Figure 2:
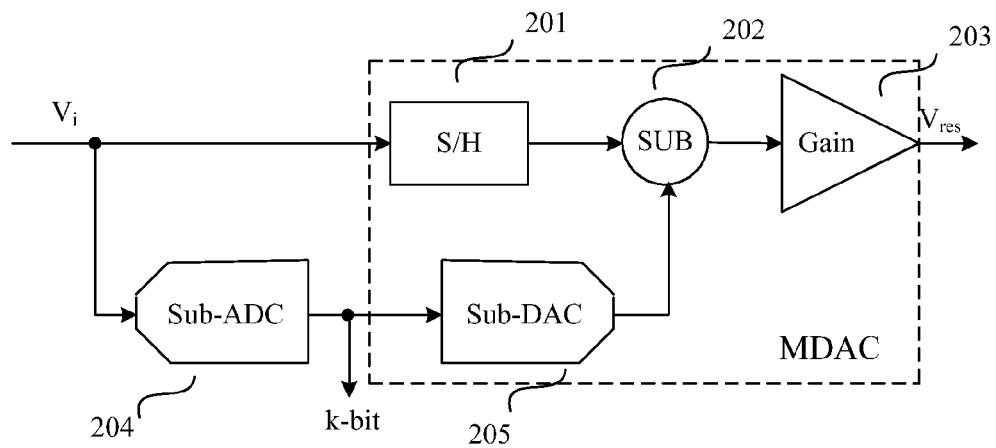
FIG. 2 is a schematic diagram of a conversion circuit for each sub-stage of pipelined ADC as shown in FIG. 1.
Figure 3:
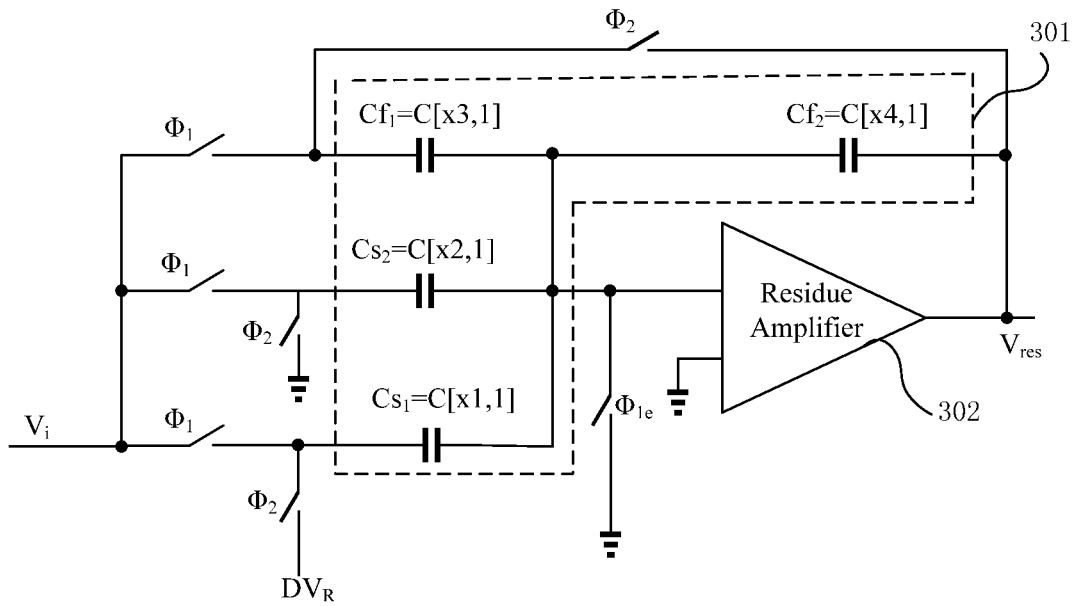
FIG. 3 is a schematic diagram of multiplying digital to analog circuit of unit capacitor array as shown in FIG. 2.
Figure 4:
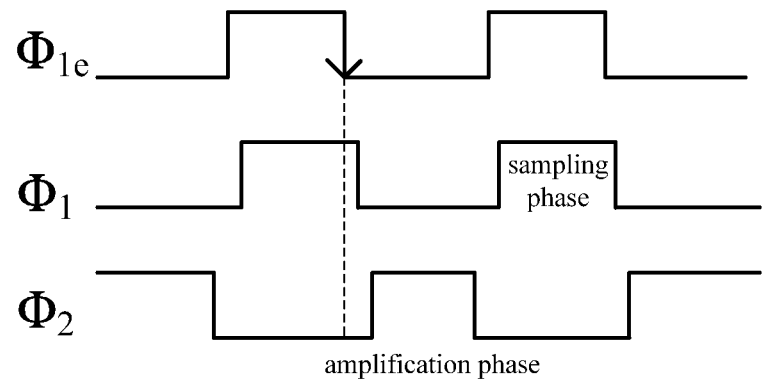
FIG. 4 is a timing diagram of sampling phase clock signal and feedback phase clock signal for multiplying digital to analog circuit of unit capacitor array as shown in FIG. 3.

If M and N are respectively lines and rows of capacitor array layout as shown in FIG. 8, wherein M denotes the numbers of capacitors being at right angles to signal current and N denotes the number of capacitors being paralleled to signal current. M and N are integral multiples of 0.5. When M and N are odd multiples of 0.5, the half of the dummy capacitors on the edge is applied to the layout. FIG. 8 shows inner capacitor array (the area within line 61) and external dummy capacitor array (the area between line 61 and line 62) wherein the dummy capacitor array is designed around the inner capacitor array. The inner capacitor array is referred to the layout of several kinds of capacitors, as same as the layout of capacitors Cs1, Cs2, Cf1 and Cf2 as shown in FIG. 3. The MDAC capacitor array is a symmetric layout having two symmetric unilateral inner capacitor arrays.

Hereinafter, the preferred embodiments of the invention will be described using the drawings. It should be understood that the following embodiments are provided just for describing the invention, instead of limiting the scope of the invention.

The invention provides a design method generating a well-matched unit capacitor array layout within a limited layout size. FIG. 9 is a flow sheet for the present invention. It should be understand that the flow sheet not only reflects the capacitor array layout design of pipelined ADC, but also can be applied to digital-to-analog converter and switch capacitance filter requiring well-matched capacitor arrays.

The design flow are described in four Steps: Step 71, defining the wiring mode of unit capacitor. Step 72, defining the layout of capacitor array. Step 73, disposing the wires of the capacitor array. Step 74, characterizing the parasitic parameters for the layout and verifying the layout design. The capacitors Cs1, Cs2, Cf1, Cf2, referred in the embodiment, are examples reflecting a pipelined ADC. It is possible that pipelined ADCs may have only two kinds of capacitors (Cs1 & Cf1 or Cs1 & Cf2) or consists of three kinds of capacitors (Cs1 & Cs2 & Cf1). As to digital-to-analog converter and switch capacitance filter requiring well-matched capacitor arrays, the layout may not includes a sampling capacitor and feedback capacitors but apply the same principles and design method to the layout generation. The design method works for the layout comprising one kind of capacitors. The classification of capacitors is defined according to specific applications of circuits.

To be specific, Step 72 (defining the layout of capacitor array) consists of four steps:

Step 720, defining Mh as the maximum lines of unilateral inner capacitor array layout.

Step 721, defining the least lines M1 of capacitor Cs1 in the unilateral inner capacitor array layout.

Step 722, defining the line numbers M2, M3 and M4 of Cs2, Cf1 and Cf2 respectively in the unilateral inner capacitor array layout. If the layout only features one kind of capacitors, Step 722 can be left out.

Step 723, defining the layout of unit capacitors of the capacitor array. All steps, described in design flow, matter for generating a well-matched capacitor array. The steps are described in details including design principles and methods.

FIG. 10 shows an embodiment of Step 71. The wires being connected to upper and lower plates are paralleled to signal current. A wire, being connected to lower plate, is aluminous wire 1 being symmetrically placed at both sides of lower plate. When external signal is connected to the lower plate of the capacitor, the aluminous wire 1 is connected to the lower plate through via 10. It should be noticed that one of two aluminum wires 1 or both of that being connected to the lower plates of unit capacitors are required specifically and described in Step 73. No via is in need when external signal is not connected to the lower plate. A wire, being connected to the upper plate, is aluminum wire 2 being set at the center of a capacitor. All capacitors of pipelined ADCs, namely capacitors Cs1, Cs2, Cf1 and Cf2, apply the wiring mode as shown in FIG. 10 to the layout.

Each unit capacitor features identical ambient layout by using the same wiring mode. The wires, being connected to the lower and upper plates, parallels signal current. In the other word, the wire being connected to the upper plate parallels the wire to the lower plate. The wires are set within the area of unit capacitor decreasing capacitance mismatching errors caused by mismatched perimeter and different etching rate. The layout looks perfect by downsizing the layout without complexity and mess.

It is true that the signal connection to a line of capacitors is limited to no more than two as the lower plates of unit capacitors are connected to external signals through two aluminum wires 1.

According to Step 72, capacitors with the same wiring mode are placed in lines within a limited area. The way to define the line number of one kind of capacitors is described as follows for capacitor Cs1, Cs2, Cf1 and Cf2 of pipelined ADCs, as well as the layout design.

Firstly, Step 720 is to define the maximum Mh of lines within unilateral inner capacitor array. As shown in FIG. 8, Mdx denotes the line number of external dummy capacitors in vertical direction of signal current. Mdy denotes the row number of external dummy capacitors in direction of signal current. Mdx and Mdy are designed no less than 1.5 in ways that generate an identical ambient for each unit capacitor. The inner capacitor array layout reflects the layout of several kinds of capacitors, in particular the layout of capacitor Cs1, Cs2, Cf1 and Cf2. Therefore, the size of unit capacitor and the area of dummy capacitor help to decide the maximum M of lines of capacitor array. The maximum M is in direct proportion to layout size. Given a certain layout size, the layout features a maximum M in inverse proportion to the size of unit capacitor requiring efficiency and perfection. The maximum Mh of lines of unilateral inner capacitor array equals to the difference between the half of the maximum M of lines of capacitor array and the line number Mdx of dummy capacitors. Namely, Mh=M/2−Mdx, wherein Mh is an integer and Mdx≥1.5. As for the embodiment, if the line number of dummy capacitors is 1.5, then Mh is 7 on condition of 17 lines at most for the layout. It works for other embodiments when the line number of dummy capacitors is more than 1.5.

Secondly, Step 721 is described defining the least line number of Cs1 capacitors in unilateral inner capacitor array. As recited in Step 71, the wiring mode of unit capacitors contributes to an identical ambient of unit capacitors and leads to no more than two signals being connected to each line of capacitors. As to MDAC structure, capacitor Cs1 includes x1 unit capacitors being controlled to switch on or off Voltage Reference (VR) by output code D of comparators at amplification phase. The unit capacitors of capacitor Cs1 features different wiring modes as the lower plates of x1 unit capacitors of capacitor Cs1 are connected to different signals. So M1=x1/2, M1 is the least line number of capacitor Cs1 in unilateral inner capacitor array. For example, if the number of Cs1 capacitor x1 is 7, then the least line number M1 of capacitors Cs1 is 3.5 in the unilateral inner capacitor array.

Thirdly, Step 722 is described defining the line number M2 of capacitors Cs2, the line number M3 of capacitors Cf1 and the line number M4 of capacitors Cf2 in unilateral inner capacitor array. As for MDAC structure, capacitor Cs2 consists of x2 unit capacitors. Featuring the same wiring mode at amplification phase, the unit capacitors are placed in one line or lines. Unit capacitors of capacitor Cs2 and Cs1 can be designed in one line on condition the least line number M1 of Cs1 capacitors is odd multiples of 0.5. The layout of capacitor Cf1 and Cf2 works likewise.

Therefore, various capacitor array layouts can be realized on condition that first, M1, M2, M3 and M4 are no more than Mh, and second, no more than two capacitors of different wiring modes are designed in one line of capacitors. The wiring modes of capacitors are described as follows. As shown in FIG. 3, the upper plates of capacitors Cf1, Cf2 and Cs2 are connected to the input end of Residual Amplifier 302. The wiring modes of the lower plates are described as follows: the lower plate of capacitor Cf1 is connected to input signal Vi at sampling phase clock signal Φ1 and the output end Vres of Residual Amplifier 302 at feedback phase clock signal Φ2. The lower plates of capacitors Cf2 are connected to Vres at both sampling phase clock signal Φ1 and feedback phase clock signal Φ2. The lower plate of capacitor Cs2 is connected to input signal Vi at sampling phase clock signal Φ1 and grounded at feedback phase clock signal Φ2. In this way, any two kinds of capacitors Cf1, Cf2 and Cs2 can be designed in one line. But all three of them can not be placed in one line as they have different wiring modes from one another.

Trade-off between line number M and row number N can be realized if Mh permits. The row number N of the layout increases as the line number M2 of capacitor Cs2 decreases and the number of unit capacitor x2 of capacitor Cs2 increases. If Mh permits, the row number N of the layout can be decreased by proportionally increasing the line number M2 of capacitors Cs2. The line number M3 of capacitors Cf1 and the line number M4 of capacitors Cf2 work likewise. The row line N of the layout has to be increased, otherwise the total line number of the layout may exceed the set number Mh.

Fourthly, Step 723, the last move of Step 72, is described as follows. All kinds of capacitors are properly placed featuring facility in external wiring of the layout. For pipelined ADCs, the layout of unilateral inner capacitor array is shown in FIG. 11, wherein capacitors Cs2 are placed at the center of the layout in M2 lines and capacitors Cf1 and Cf2 are set on the edge of the layout respectively in M3 lines and M4 lines providing output wires. Capacitors Cs1 are designed in the area between capacitors Cs2 and capacitors Cf1 and Cf2 in M1 lines. The blank area of the unilateral inner capacitor array is filled with dummy capacitors. No less than 1.5 circuits of dummy capacitors are required being placed around inner capacitor array, which is not shown in FIG. 9.

For example, if 17 lines can be designed at most for the layout, the number x1 of capacitors Cs1 is 7, the unit capacitor number x2 of capacitors Cs2 is 7, the unit capacitor number x3 of capacitors Cf1 is 2 and the unit capacitor number x4 of capacitors Cf2 is 2, then regarding unilateral capacitor array, Mh is 7 and the least lines M1 of capacitor Cs1 is 3.5. The sum of line numbers of Cs2, Cf1 and Cf2 should be no more than the difference between Mh and M1, namely, M2+M3+M4≤Mh−M1 and Mh−M1=3.5. FIG. 12 shows the capacitor array layout with capacitors Cs2 being placed in the center of the layout of unilateral inner capacitor array, capacitors Cf1 and Cf2 being designed on the edge of the layout of unilateral inner capacitor array and capacitors Cs1 being set in the area between capacitors Cf1 and Cf2 and capacitors Cs2. The 1.5 circuits of dummy capacitors are not shown in the FIG. 12. As shown in FIG. 12, tab 100 denotes unit capacitors of capacitors Cf1. Tab 200 denotes that of capacitors Cf2. Tab 300 denotes that of capacitors Cs1 and tab 400 denotes that of capacitors Cs2.

Capacitors Cf1 are placed in 3.5 lines and every two unit capacitors are designed in one line. The number of capacitors Cs2 is 7 being designed in two lines without increase of the layout's rows N. Capacitors Cf1 and Cf2 are set in one line with the blank area being filled with dummy capacitors as the line number M of the layout is limited. In this way, the line number of unilateral inner capacitor array is 7 and the row number is 4. Adding 1.5 circuits of dummy capacitors, the line number of unilateral capacitor array equals to 8.5 and the row number is 7.

Step 73 is about to dispose the wires of the capacitor array after defining the layout of capacitor array. As shown in FIG. 13, the parasitic capacitance mismatching between unit capacitors is mainly caused by the parasitic capacitance between aluminum wire 2 to the upper plate and the aluminum wire 1 to the lower plate since the wire mode has been defined for unit capacitors in Step 71. As shown in FIG. 13, parasitic capacitor Cp1 is added to capacitor 91 and caused by the parasitic capacitance between the wire to the upper plate of capacitor 91 and that to the lower plate of capacitor 91. Parasitic capacitor Cp2 is added to the other unit capacitor, wherein the wire to the upper plate of the unit capacitor is connected to the upper plate of capacitor 91 and the lower plate of the unit capacitor is connected to the aluminum wire 1 on the right side as shown in FIG. 13. The parasitic capacitance is relevant to the metal-to-metal space and the length of wires, wherein parasitic capacitance Cp increases as the metal-to-metal space decreases and the length L increases. The metal-to-metal spaces are the same as the wiring mode is defined. Therefore, if the length L is fixed, then the parasitic capacitance Cp of unit capacitors is constant.

FIG. 14 is a schematic of wiring modes corresponding to the layout schematic of the capacitor array as shown in FIG. 12. The wiring mode of the capacitor array is illustrated in collaboration with FIG. 14. As for the MDAC of pipelined ADC, the upper plates of capacitors Cs1, Cs2, Cf1 and Cf2 are connected to the input end of operational amplifier through aluminum wire 2 in the direction of signal current. And the lower plates of all unit capacitors are connected to the external in reverse direction of signal current. As mentioned above, the lower plates of unit capacitors of capacitors Cs 1 feature no more than two wiring modes in one line. When the lower plates of capacitors Cs1 is connected to signals, two wiring modes are applied to the lower plates of unit capacitors of capacitors Cs1. When two wiring modes are used for capacitors in one line, each capacitor of line M12, M13 and M14 has one aluminum wire 1 being connected to the lower plate through via as shown in FIG. 14. When only one wiring mode is used for capacitors in one line, each capacitor of line M11, as shown in FIG. 14, has two aluminum wires 1 being connected to the lower plate through via. In this way, the length L of paralleled wires being connected to unit capacitors is twice the length of unit capacitor.

Capacitor Cs2 works likewise at amplification phase being placed in one line or multiple lines. As shown in FIG. 14, all unit capacitors of capacitors Cs2 are lined in M21 and M22 with two aluminum wires 2 being connected to the lower plates through via in ways that make the length L of wires being connected to unit capacitors equal to twice the length of unit capacitor. When unit capacitors of capacitor Cs2 and other unit capacitors are placed in one line, only one aluminum wire 1 is connected to the lower plates of unit capacitors through via.

The capacitor Cf1 and Cf2 work the same way to make sure that the length L is twice the length of unit capacitor. For example, the capacitors Cf1 and Cf2 are designed in one line with one aluminum wire 1 being connected to the plates of unit capacitors as shown in FIG. 14. The upper and lower plates of dummy capacitors are grounded which has not been illustrated in FIG. 14.

Step 74 is about to characterize parasitic parameters in ways that verify the capacitor array layout and identify the mismatching of the layout. Parasitic parameters of unit capacitors are characterized and analyzed based on ASSURA.

As MOS technology grows, mismatching of capacitors is severely relevant to parasitic capacitance. The layout design method works to generate a well-matched capacitor array by eliminating mismatched parasitic capacitance. The invention can be applied to designing capacitor array layouts fabricated in advanced technology and Metal-Metal capacitor array layouts.

The foregoing preferred embodiments are provided to describe, not to limit, technical approaches in the present invention. Obviously, bearing the essence and concept of the present invention, technologists in this field can make various changes and redesigns to the present invention. It should be understood that those changes and redesigns are also covered by claims of the present invention, if they are with the same purpose and within the same scope of the present invention.

What is claimed is:

1. A layout design method of a capacitor array, wherein the capacitor array comprises first class capacitors to Kth class capacitors, K is an integer no less than 1, each capacitor comprises several unit capacitors, the design method comprises:
   defining a wiring mode of the unit capacitors: made a wire connected to a upper plate be parallel with a wire connected to a lower one, and the wires connected to the lower plate of each unit capacitor are the same kind of metal being designed symmetrically on the both sides of each unit capacitor, the wires connected to the upper plate of each unit capacitor are the same kind of metal being centered at each unit capacitor;
   defining the layout of the capacitor array: the capacitor array comprises M lines and N rows, wherein the capacitor array consists of an inner capacitor array and an external dummy capacitor array, the external dummy capacitor array is designed around the inner capacitor array being made up of a plurality of dummy capacitors, the inner capacitor array comprises two symmetric unilateral inner capacitor arrays, (a) Mh is defined as the maximum number of lines of the inner capacitor array and expressed as Mh=M/2−Mdx, wherein Mh is an integer, Mdx denotes the line number of the external dummy capacitor array, Mdx≥1.5, (b) the line numbers of the first class to the Kth class capacitors are defined for the inner capacitor array, (c) the capacitors are placed on the layout wherein the sum of the line numbers of the first class to the Kth class capacitors is no more than Mh and no more than two wiring modes are used for the capacitors in each line;
   wiring the capacitor array: the wiring mode is set for the capacitor array requiring that the lengths of the paralleled wires being connected to the upper and lower plates of each unit capacitor are equal; and
   parasitic parameters are characterized in ways that verify the layout design.

2. The layout design method according to claim 1, wherein, according to step (b) "The line numbers of the first class to the Kth class capacitors are defined for the inner capacitor array", if one kind of the capacitors consists of x1 unit capacitors applying several wiring modes to the unit capacitors, the least lines of the capacitor equals to x1/2.

3. The layout design method according to claim 2, wherein, as to the step of "defining the layout of the capacitor array", the dummy capacitors are added at the blank area of the inner capacitor array after defining Mh and the line numbers of each type of capacitors in the layout.

4. The layout design method according to claim 1, wherein, as to the step of "defining the layout of the capacitor array", the dummy capacitors are added at the blank area of the inner capacitor array after defining Mh and the line numbers of each type of capacitors in the layout.

5. The layout design method according to claim 1, wherein, if two different wiring modes are used for one line of capacitors, only one of two metal wires, being designed at both sides of the lower plates of unit capacitor, is connected to the lower plate of unit capacitor through a via.

6. The layout design method according to claim 1, wherein, if only one wiring mode is used for one line of capacitors, both metal wires, being designed at the lower plates of unit capacitor, are connected to the lower plate of unit capacitor through a via.

7. A capacitor array, comprising: a plurality of capacitors being distributed in M lines and N rows, wherein, the capacitor array consists of an inner capacitor array and an external dummy capacitor array, the external dummy capacitor array is designed around the inner capacitor array being made up of a plurality of dummy capacitors;

the inner capacitor array comprises two symmetric unilateral inner capacitor arrays, comprising a first class to a Kth class capacitors, K is an integer no less than 1, each capacitor comprises several unit capacitors, the wire being connected to the upper plate of each unit capacitor parallels to the wire being connected to the lower plate, the lower plates of the unit capacitors are connected by wires with the same kind of metal being designed symmetrically on the both sides of each unit capacitor, the upper plates of the unit capacitors are connected by the wires with the same kind of metal being centered at each unit capacitor, the upper plate of said unit capacitor equals to and parallels to the lower plate of the unit capacitor, Mh is defined as the maximum number of lines of the inner capacitor array and expressed as Mh=M/2−Mdx, wherein Mh is an integer, Mdx denotes the line number of the external dummy capacitor array, Mdx≥1.5, the sum of line numbers of the first class to the Kth class capacitors is no more than Mh and no more than two wiring modes are used for capacitors in each line.

8. The capacitor array according to claim 7, wherein, if one kind of the capacitors consist of x1 unit capacitors being connected by two different wiring modes, then the least line number of the capacitor equals to x1/2.

9. The capacitor array according to claim 8, wherein the dummy capacitors are added at the blank area of the inner capacitor array beyond the area being filled with the first class to the Kth class capacitors.

10. The capacitor array according to claim 7, wherein the dummy capacitors are added at the blank area of the inner capacitor array beyond the area being filled with the first class to the Kth class capacitors.

11. The capacitor array according to claim 7, wherein, when two different wiring modes are applied to one line of capacitors, one of two wires, being designed at both sides of the lower plate, is connected to the lower plate of unit capacitor through a via.

12. The capacitor array according to claim 7, wherein, if only one wiring mode is applied to one line of capacitors, then both wires, being placed at both sides of the lower plate, are connected to the lower plate of unit capacitor through a via.

* * * * *